(12) United States Patent
Bussy

(10) Patent No.: US 11,703,533 B2
(45) Date of Patent: Jul. 18, 2023

(54) FAULT DETECTION BY MULTI-CARRIER TIME-DOMAIN REFLECTOMETERY (MCTDR)

(71) Applicant: SAFRAN ELECTRICAL & POWER, Blagnac (FR)

(72) Inventor: Emmanuel Bussy, Moissy-Cramayel (FR)

(73) Assignee: SAFRAN ELECTRICAL & POWER, Blagnac (FR)

( * ) Notice: Subject to any disclaimer, the term of this patent is extended or adjusted under 35 U.S.C. 154(b) by 3 days.

(21) Appl. No.: 17/439,164

(22) PCT Filed: Mar. 16, 2020

(86) PCT No.: PCT/FR2020/050543
§ 371 (c)(1),
(2) Date: Sep. 14, 2021

(87) PCT Pub. No.: WO2020/188208
PCT Pub. Date: Sep. 24, 2020

(65) Prior Publication Data
US 2022/0163581 A1 May 26, 2022

(30) Foreign Application Priority Data
Mar. 15, 2019 (FR) ...................... 1902723

(51) Int. Cl.
*G01R 31/00* (2006.01)
*G01R 31/11* (2006.01)
(52) U.S. Cl.
CPC ............ *G01R 31/008* (2013.01); *G01R 31/11* (2013.01)

(58) Field of Classification Search
CPC .............................. G01R 31/008; G01R 31/11
USPC ......................................................... 324/503
See application file for complete search history.

(56) References Cited

U.S. PATENT DOCUMENTS 9,588,169 B1 * 3/2017 Watkins ................. G01R 31/58
2011/0015882 A1 1/2011 Guilhemsang et al.

FOREIGN PATENT DOCUMENTS

WO WO 2016/192980 A1 12/2016

OTHER PUBLICATIONS

French Search Report for French Application No. 1902723, dated Nov. 11, 2019.
International Search Report for International Application No. PCT/FR2020/050543, dated Aug. 17, 2020.
(Continued)

*Primary Examiner* — Farhana A Hoque
(74) *Attorney, Agent, or Firm* — Birch, Stewart, Kolasch & Birch, LLP

(57) ABSTRACT

The invention relates to a method for detecting events by reflectometry in an electrical line of an avionic system, said line being fed with an AC voltage at a first frequency (f1), said AC voltage being sinusoidal and composed of a succession of alternate half-periods, said method comprising a step of injecting a reflectometry signal into the network, the reflectometry signal having a second frequency (f2) higher than the first frequency (f1); wherein the injecting step is synchronized with the AC voltage, the injecting step being carried out by injecting the reflectometry signal into the network during an injection duration (ti) comprised between the start and end of a half-period (t1) of the AC feed voltage.

9 Claims, 4 Drawing Sheets

(56) References Cited

OTHER PUBLICATIONS

Sallem et al., "Wire arc defect localization and mathemetical characterization my MCTDR reflectometry", 2017 IEEE Autotestcon, Sep. 9, 2017, pp. 1-6.

Sharma et al., "Modeling of STDR system for locating faults in live aircraft wires", 2013 International Conference on Emerging Trends in Communication, Control, Signal Processing and Computing Applications (C2SPCA), Oct. 10, 2013, pp. 1-6.

\* cited by examiner

FAULT DETECTION BY MULTI-CARRIER TIME-DOMAIN REFLECTOMETERY (MCTDR)

GENERAL TECHNICAL FIELD AND PRIOR ART

The invention relates to the general field of MultiCarrier Time Domain Reflectometry MCTDR detection methods, in particular the methods for detecting an electric arc in an electric circuit.

In constrained environments, in particular in the avionics systems, the increase in the on-board power levels increases the wiring density and therefore the risks of electric arcs.

On conventional networks, made up of AC voltage networks (typically 115/230 V), the transitions of the voltage to 0 volts are favorable to the extinction of the arcs. In DC voltage networks (typically with a voltage level of 28 V), the transported power does not promote the creation and the dangerousness of the electric arcs.

In case of increase in these voltage levels and/or the choice of a transition into DC voltage, this significantly increases the risk of electric arcing, in particular due to the proximity of the cables relative to each other.

The state of the art of the active detection systems marketed or simply studied shows weaknesses in the levels of reliability of detection of the electric arcs and of robustness relative to the environment.

The reliability is the major criterion for acceptability of an active detection system. It must be able to detect all types of electric arcs:
parallel and series arcs,
arcs of different powers,
arcs of different durations,
whatever their positions on the electricity network.

An electric arc behaves like low impedance added in parallel or in series to the network. This results in a more or less significant evolution on the signals measured by the cut-off systems. For example, the network current will be strongly impacted during a parallel arc. On the contrary, during a series arc, the current seen by the cut-off system will be very slightly altered.

Reflectometry methods have been proposed so as to detect the electric arcs.

Such methods are configured to detect slow or fast local impedance variations.

One such method consists of injecting a signal into a cable and then of detecting the waves reflected on the different characteristic impedance discontinuities.

A known conventionally used on-board electric arc detection solution utilizes the MCTDR (MultiCarrier Time Domain Reflectometry) technology.

This technology, which is for example described in detail in the application WO2016192980, is capable of detecting the slow or fast local impedance variations (sharp and intermittent faults).

However, it is observed that the AC networks present on aircrafts (for frequencies up to 800 Hz) impact the reliability of such a detection system.

Indeed, the variability of the AC network (and therefore of the voltage and current levels) causes the energy of the arc and its impedance to vary rapidly. Consequently, depending on the specific moment of injection of the reflectometry signals, it may influence the local impedance mismatch peak measured on the reflectogram.

It is conventionally understood by local impedance mismatch (or matching), a principle qualifying the ratio between impedance measurements made along the propagation of the signal on a mesh network. The mesh has a pitch of one unit length. The local term is then assimilated to the ability to distinguish the characteristic impedance variations between each pitch of the mesh. This is then the measurement of the impedance variation based on the distance from the transmitter.

In AC networks whose frequency can be up to 800 Hz, the signal processed by a reflectometry detection system can be very noisy.

To increase the robustness, one method consists of raising the detection thresholds, but sometimes to the detriment of the detection reliability. And this consequence on reliability is all the more pronounced as the frequency of the network is significant because the duration of the arc fault in a signal half-period is a function of the frequency of the network. The shorter the fault, the more difficult it is to detect.

Then, for higher frequencies (800 Hz networks for example), the speed at which the arc impedance mismatch appears/disappears is increased since the arc is born and extinguished during a signal half-period. In the event that the arc does not restart systematically in the next half-period, this could lead to detection failures for such a detection system.

Indeed, depending on the complexity in the creation of the reflectometry signals to be transmitted, the duration of the sending of a series of patterns may be too long compared to the duration of these faults.

Some arc events could be failed (not enough patterns are superimposed on the arc with respect to the chosen detection thresholds). In some cases, in particular in systems in which the signals from the tracking of multiple lines are multiplexed, the risk of non-detection of event is increased.

A method for detecting an electric arc by reflectometry with synchronization of the reflectometry signals is already known from U.S. Pat. No. 9,588,169.

This method does not use MCTDR signals. The objective of the synchronization is very far from those of the invention, insofar as it is about making ensure that a number of reflectometry signals are sent based on the frequency of the monitored signal (100 or 120 relative to the frequencies 50 or 60 Hz).

GENERAL PRESENTATION OF THE INVENTION one aim of the invention is to promote the detection of arcs by a reflectometry device.

Another aim of the invention is to reduce the computing time of the processing signal in a reflectometry detection method.

Another aim is to increase the robustness of the reflectometry arc detection devices and limit their response to measurement noises.

The invention proposes a method for detecting an electric arc by MultiCarrier Time Domain Reflectometry MCDTR in an electric line of an avionics system, said line being supplied by an AC voltage at a first frequency, said AC voltage being composed of a succession of alternate half-periods, said method including a step of injecting a reflectometry signal into the network, the reflectometry signal being an MCTDR diagnosis signal;

The injection step is carried out by injecting the reflectometry signal into the network during an injection window which is included in a half-period of the AC supply voltage and which is synchronized on the one hand to include a moment of said half-period when the arc current is statistically potentially maximum and on the other hand to exclude part of the half-period when the arc current is statistically less significant.

Optionally but advantageously, the invention can be supplemented by the following characteristics taken alone or in combination:

the injection step is initiated at an injection time after the beginning of a half-period, the injection time and the beginning of the half-period being separated in time;

the injection time is located after a half-period portion, the half-period portion being a duration from the beginning of the half-period and representing a half-period portion, the half-period portion representing between 5% and 95% of the half-period duration, preferably between 40% and 60% of the half-period duration, for example 45%;

the injection of reflectometry signals stops from a stop time after the injection time and before the end of the half-period;

the stop time is the end of a transmission stop portion, the transmission stop portion being between the value of the half-period portion and 100%, preferably between the value of the half-period portion and 90%, for example 83%;

the method includes a continuous setting method including the following steps:

S1/Acquiring in real-time the AC voltage signal from the network,

S2/Defining the injection time based on the sign change time,

S3/Setting a clock timed at a third frequency, preferably identical to the first frequency, S4/Generating reflectometry signals, S5/Injecting the reflectometry signals timed at the third frequency and shifted at the injection time, in which the continuous setting method is configured to be able to be implemented in parallel with the detection method, so as to update the parameters of the detection method and to synchronize the detection method and the network;

the continuous setting method is configured to be implemented every N half-periods of the AC voltage signal, N being greater than or equal to 1.

According to another aspect, the invention proposes a MultiCarrier Time Domain Reflectometry MCTDR detection device including:

An acquisition element connected to the line and configured to acquire the signals passing through the line;

A setting element connected to the acquisition element, the setting element including a memory in which code data are stored, the code data including algorithms that allow the execution of a detection method according to the invention;

A timing clock connected to the setting element and configured to define the beginnings of injection steps during the detection method;

A reflectometry signal generation unit connected on the one hand to the timing clock and on the other hand to the conversion element, the generation unit being configured to generate the reflectometry signals based on the parameters defined by the timing clock and the setting element.

According to another aspect, the invention proposes an avionics system including a reflectometry detection device according to the invention.

PRESENTATION OF THE FIGURES

Other characteristics and advantages of the invention will emerge from the following description, which is purely illustrative and not limiting, and which should be read in relation to the appended figures in which.

DESCRIPTION OF ONE OR SEVERAL MODES OF IMPLEMENTATION AND EMBODIMENTS

Figure 1:
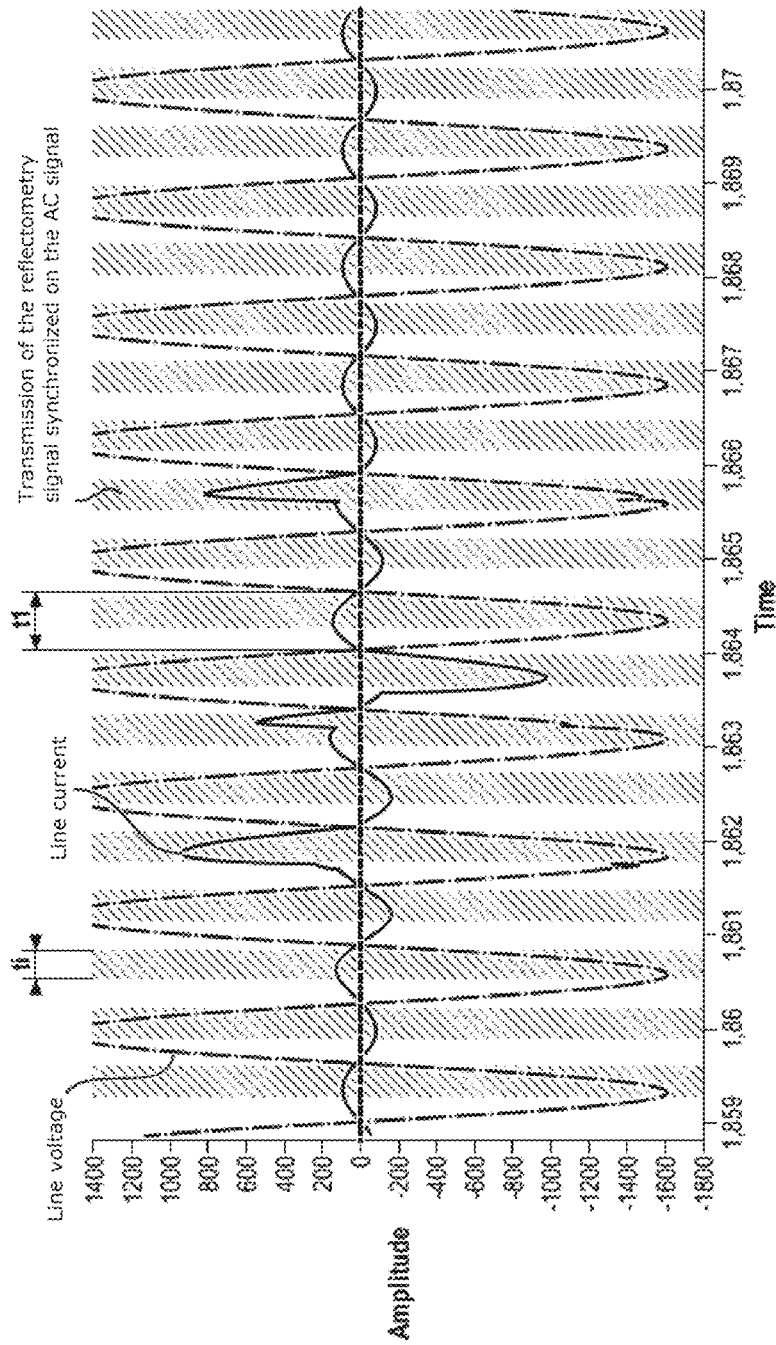
FIG. 1 is a voltage/current reading as a function of time, which represents the injected signals into the network during a detection method similar to the invention.

A method for detecting an electric arc by reflectometry in a network supplied by an AC voltage signal is represented in FIG. 1, in the form of a current/voltage reading as a function of time.

The AC voltage signal has a first frequency f1 and a half-period t1. By half-period t1 is meant here a portion of the period of the periodic signal during which the voltage of the periodic signal remains positive or negative.

A half-period therefore extends from a first time at the moment of the transition of the voltage to the 0V potential, to a second time which is the moment of the transition of the voltage to 0V after the first time.

The method includes a step of acquiring the AC voltage signal passing through the network, advantageously carried out continuously.

The acquired signal undergoes a processing step that allows identifying the beginning of the half-period t1. It is therefore a frequency processing.

The method further includes a step of injecting a reflectometry signal into the network, the reflectometry signal being an MCTDR diagnosis signal.

It is recalled here that an MCTDR reflectometry signal is a sum of a finite number of sinusoids at a given set of frequencies, chosen outside the operating frequencies of the system under test (frequencies greater than the frequency f1).

For an example of MCTDR operation, reference can advantageously be made to the application WO2016192980.

The injection step is carried out by synchronizing the injection of the reflectometry signal into the network on the AC voltage signal of frequency f1.

The synchronization is particularly made to take into account the arc currents statistically observed over a half-period.

Indeed, for a parallel arc, its impact over a signal half-period is statistically presented as an increase in the arc current then a decrease, within the half-period. There is therefore an arc current maximum in each half-period impacted by the arc. When this arc current is maximum, the impedance of this arc is minimum. At this specific moment, a reflectometer is in an optimal condition to detect it.

Thus, the synchronization is made so that the time window of injection of the MCTDR diagnosis signals includes the moment when the arc current is maximum and excludes the moments when it is certain that the arc will be absent or will have an impact on the very low detection.

Figure 2:
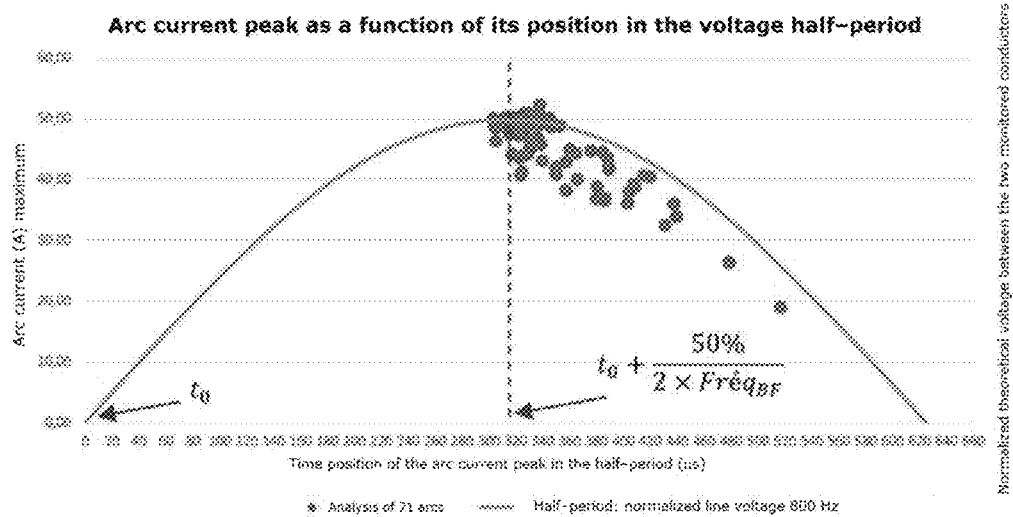
FIG. 2 is a graph illustrating the time position of the current peaks over an AC voltage half-period.

In FIG. 2, the arc current (and therefore detectability) maxima are directly related to the points on the curve, so it is not interesting to send signals at other moments.

As a reminder, an MCTDR type measurement performs an impedance measurement average over a given window.

Since the arc is a brief event and the MCTDR type measurement performs an average of the impedance measurements over the time window over which the MCTDR signals are sent, then it is essential to make sure that this time window coincides at best at the appearance of an electric arc within a half-period.

As observed on the curve in FIG. 2, the electric arc is less present (but especially less impacting) at the beginning of the half-period. Thus, sending part of the time window of the MCTDR signals over this first half of the half-period would have the impact of reducing the reliability of detection of the arc by an MCTDR type reflectometer.

Figure 3:
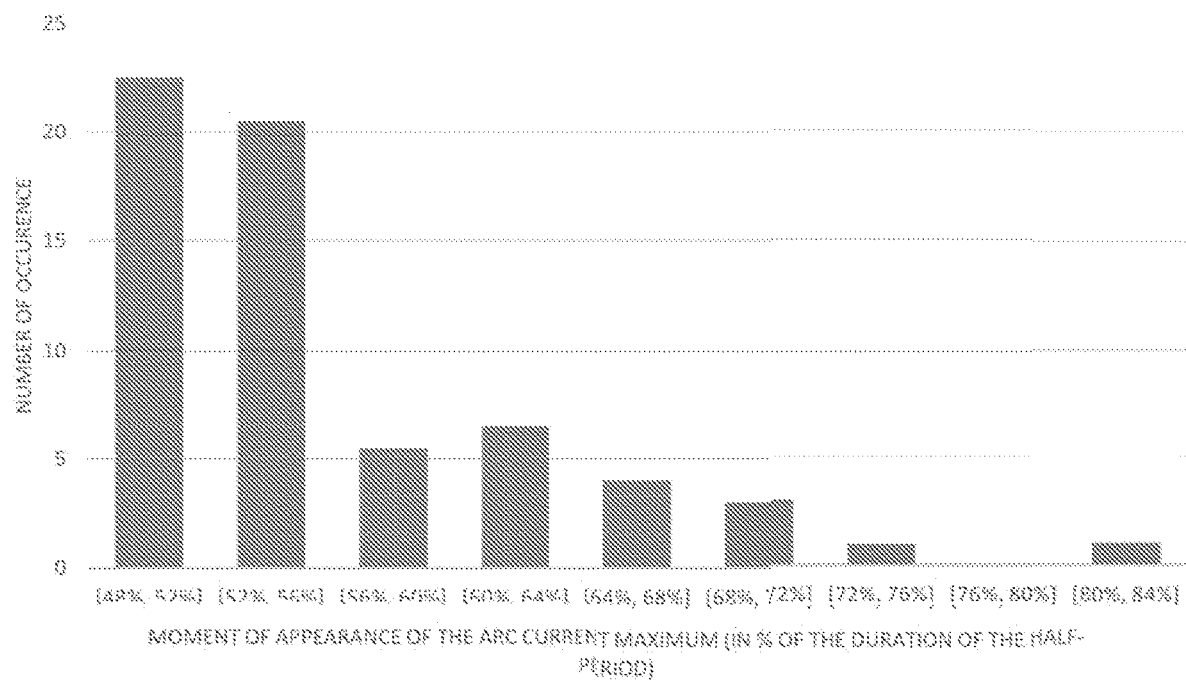
FIG. 3 illustrates the statistical distribution of the arc current maxima in a current half-period.

The statistical distribution of the arc current maxima based on the moment of appearance of these maxima (as a percentage of the duration of the half-period) is illustrated in FIG. 3.

Thus, the reflectometry signal is injected into the network for an injection duration ti less than the half-period t1. The injection window is included in a half period of the AC supply voltage (half period when the AC voltage signal has a constant sign). It is synchronized thereon on the one hand to include a moment of said half-period when the arc current is statistically potentially maximum and on the other hand to exclude part of the half-period when the arc current is statistically less significant.

At each half-period of the AC voltage signal, a reflectometry signal is injected into the network for an injection period ti which ends before the end of the half-period of the AC voltage signal.

The reflectometry signal is therefore never transmitted when the AC voltage signal switches to a zero value.

This allows maximizing the efficiency of the arc detection device by avoiding transmitting a reflectometry signal at a moment when the arc is dissipated by a zero crossing of the AC voltage signal.

In the case of a parallel arc measurement, the reflectometry signal is thus synchronized to the moments during which the arc current values are potentially maximum.

The potential of detection of the arc by the device is therefore maximized.

This further allows limiting the measurement noise effects, which allows increasing the robustness of the detection system.

Indeed, in the case of detection of parallel arcs, synchronizing the injection periods with the potential arc current maxima can allow reading the arc detection threshold, and thus limiting the crossing of the detection threshold by the measurement noise.

In the case of a series arc, the incidence on the current is often very small as are the consequences in terms of impedance mismatch. However, as with the parallel arc, the ignition of the electric arc is catalyzed by the voltage level between the electrodes. Thus, by extension and to allow the system to be universal, the statistics of appearance of the series arc in the half-period is equivalent and so is the setting of the system.

Figure 4:
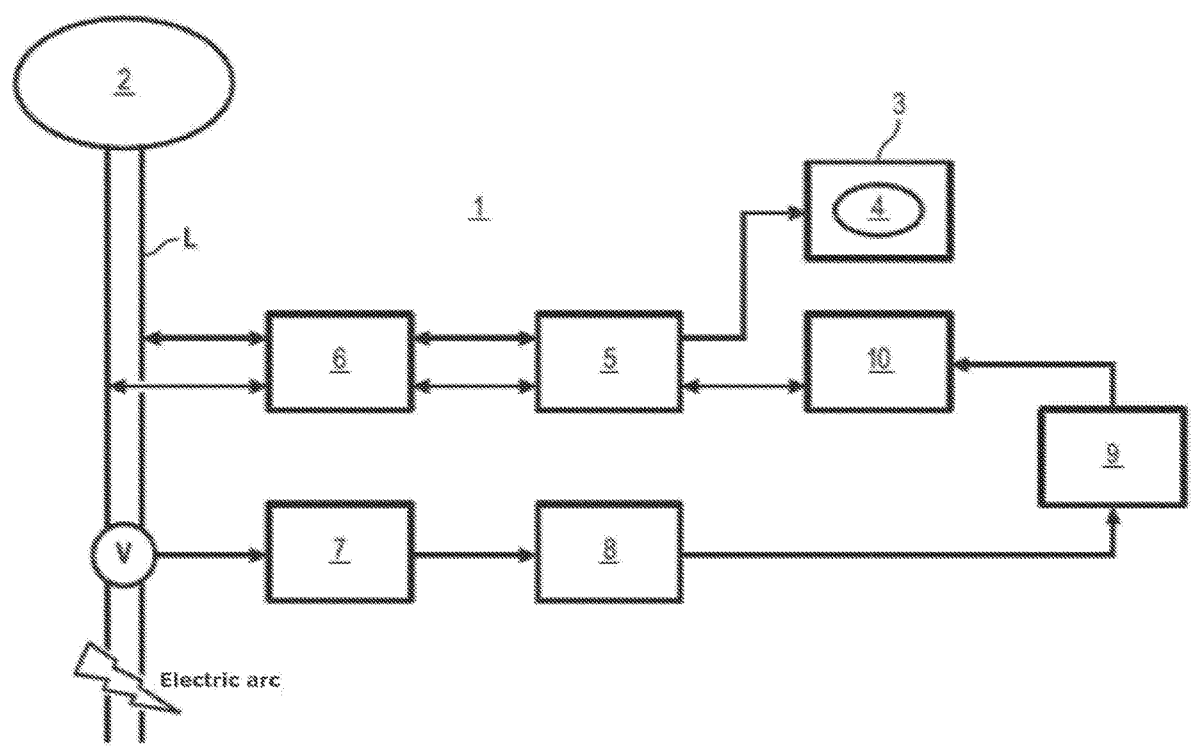
FIG. 4 is a schematic representation of a reflectometry device allowing the implementation of a method in accordance with the invention.

The reflectometry detection method is in particular carried out by means of a device 1 for detecting and locating a parallel and series arc by reflectometry on an electric line L, shown in FIG. 4.

In one embodiment, the system 1 for detecting and locating a parallel and series arc by reflectometry includes the following elements:

An AC voltage generator 2 connected to the line and configured to power the line by means of an AC voltage signal;

A correlation chip 3 including a memory 4 in which code data are stored, the code data including signal processing algorithms allowing the correlation of the signals and the diagnosis of detection/location of the faults encountered on the monitored network;

A conversion element 5 including an analog/digital converter (ADC) and a digital/analog converter (DAC). The correlation chip 3 is connected to the conversion element 5 and controls its operation;

A coupling block 6 connected to the line on the one hand and to the conversion element 5 on the other hand and configured to:
Couple the High Frequency signals from a digital/analog converter (DAC) on the monitored network,
Decouple the High Frequency signals from the monitored network to an analog/digital converter (ADC),
Protect the digital system (converters and smart digital chip) from the voltages of the network under study, An acquisition element 7 connected to the line and configured to acquire the signals passing through the line;

A setting element 8 connected to the acquisition element 7, the setting element including a memory in which code data are stored, the code data including algorithms that allow the execution of a method for setting the detection method;

A timing clock 9 connected to the setting element 8 and configured to define the beginnings of injection steps during the detection method;

A reflectometry signal generation unit 10 connected on the one hand to the timing clock 9 and on the other hand to the conversion element 5, the generation unit 10 being configured to generate the reflectometry signals based on the parameters defined by the timing clock 9 and the setting element 8.

In order to synchronize the emissions of reflectometry patterns on the line voltage signal, the setting of one embodiment of a reflectometry fault detection method may include the following steps:

S1/Acquiring in real-time the AC voltage signal from the network;

S2/Defining an injection time I1 for which the diagnosis is started by reflectometry, based on a sign change time I0 coinciding with the transition to 0 V of the voltage of the AC voltage signal (beginning of the half-period);

S3/Setting a clock timed at the third frequency f3, preferably identical to the first frequency f1 (that of the network);

S4/Generating the reflectometry signals;

S5/Injecting the reflectometry signals rated at the third frequency f3 and shifted to the injection time I1 defined above;

S6/Receiving the reflected signals;

S7/Processing the reflected signal using the electric arc detection algorithms.

Optionally, depending on the variation potentials of the signal passing through the network, the steps S2 to S5 are reiterated every N half-periods (where N≥1) of the AC voltage signal.

This allows synchronizing the reflectometry signal and the AC voltage signal at any moment regardless of the variations undergone by the network.

During step S2, the injection time I1 can be defined according to the formula:

$$I_1 = I_0 + \frac{x\%}{2 \times f1'} \qquad [\text{Math. 1}]$$

where f1' is the frequency obtained at the end of the post-processing of the AC voltage signal of the line.

A half-period portion x can be adapted, and can be between 0% and 100%, preferably between 40% and 60%, for example 45%.

It has indeed been observed that the parallel arcs do not have a maximum current value for some time after the beginning of a half-period.

Minimizing the reflectometry signal transmission time allows freeing up the bandwidth on the network and reducing the computing time required to process the signal acquired by the detection device.

Since the electric arc is catalyzed by the voltage level, the measurement of the network voltage of frequency f1 to deduce therefrom the most appropriate moment for sending reflectometry signals allows improving the detection performances.

In parallel arc, the consequence of the choice of the start of sending of these patterns, based on a statistical study, is that it is made sure that the reflectometry patterns are sent at the moment when the arc has its highest arc current. The current arc level is directly related to the mismatch peak levels observed on the reflectogram. In other words, the greater the arc current, the greater the peak, the easier the detection of a parallel arc.

And by extension, this process will be just as interesting for the diagnosis of series arcs since their appearance in the half-period is also conditioned by a minimum voltage, this one appearing statistically a little later in the half-period and being dependent on numerous parameters such as the distance between the electrodes, the inter-electrode gaseous medium, etc. Consequently, it is therefore statistically more interesting to start the diagnosis of a series arc at the injection time I1.

In series arc, the creation of the arc is also catalyzed by the voltage level. It is necessary that the voltage reaches a certain threshold in the half-period before the arc starts. The difference with the parallel arc is that the arc current obtained does not evolve during the half-period. By following the same method, it is still made sure that the reflectometry patterns are sent at the moment when the arc triggering is most likely in the half-period.

In one embodiment, it can be chosen to stop injecting the reflectometry signals into the network from a stop time I2:

$$I_2 = I_0 + \frac{Y\%}{2 \times f1'} \qquad [\text{Math. 2}]$$

The transmission stop portion Y (%) is a parameter to be specified by the designers of the detection system (Y is between X and 100%), and corresponds to a half-period proportion from which the reflectometry signal transmission is stopped. Depending on the value defined for the transmission stop portion Y, the designer can thus promote the computing time or the bandwidth by taking a transmission stop portion by specifying Y slightly higher than the half-period portion X, or promote the arc detection by taking a value close to 100%.

In one embodiment, if the transmission stop portion Y is set to 100%, this means that the designer chooses to extend the diagnosis until the end of the half-period so as not to miss any maximum of parallel arc current, to the detriment of the computation and processing speed.

Studies have been conducted and show that beyond 84% of half-period, no parallel arc current maximum has been read. Indeed, during the last percents of the half-period, the line voltage drops, the fault current also drops.

In one embodiment, the transmission stop portion Y has a value of 83%.

In addition, it has been observed that the damages created by the arcs arriving beyond a certain percentage of the half-period are less frequent and lower in energy.

In one variant, a detection system is configured to ignore them in order to save computing time or transmitted signal bandwidth.

Depending on the criteria for accepting damages that an arc can create (criteria at the designer's expense and depending on many parameters), the latter will then make the decision whether or not to ignore the weakest and least frequent faults. He will then calibrate Y accordingly.

The invention claimed is:

1. A method for detecting an electric arc in an electric line of an avionics system, said electric line being supplied by an AC voltage at a first frequency (f1), said AC voltage being composed of a succession of alternate half-periods,
   said method includes a step of injecting a diagnosis signal into the electric line, the diagnosis signal being a MultiCarrier Time Domain Reflectometry, MCTDR, signal;
   wherein the step of injecting comprises injecting the MCTDR signal into the electric line during an injection time window (ti) which is included in a half-period (t1) of the AC voltage and which is synchronized on the one hand to include a time of the said half-period at which an arc current is statistically potentially maximum and on the other hand to exclude part of the half-period at which the arc current is statistically less significant.

2. The method of claim 1, wherein the step of injecting starts at an injection time (I1) after the beginning of a half-period, the injection time and the beginning of the half-period being separated in time.

3. The method of claim 2, wherein the injection time (I1) is after a half-period portion (X %), the half-period portion being a duration from the beginning of the half-period which represents between 5% and 95% of a duration of the half-period.

4. The method of claim 2, wherein the step of injecting stops at a stop time (I2) after the injection time (I1) and before the end of the half-period.

5. The method of claim 4, wherein the stop time (I2) is at the end of a transmission stop portion (Y %), the transmission stop portion being between the half-period portion (x %) and 100%.

6. The method of claim 1, further including a continuous setting process which includes the steps of:
   S1/ Acquiring in real-time an AC voltage signal from the electric line,
   S2/ Defining the injection time (I1) based on a sign change time (I0),
   S3/ Setting a clock timed at a third frequency (f3),
   S4/ Generating reflectometry signals at the third frequency (f3),
   S5/ Injecting the reflectometry signals shifted at the injection time (I1).

7. The method of claim 6, wherein the continuous setting process is implemented every N half-periods of the AC voltage signal, N being greater than or equal to 1.

8. A MultiCarrier Time Domain Reflectometry, MCTDR, detection device including:
- An acquisition element (7) connected to an electric line and configured to acquire signals passing through the electric line;
- A setting element (8) connected to the acquisition element (7), the setting element including a memory in which code data are stored, the code data including algorithms that allow the execution of the method of claim 1;
- A timing clock (9) connected to the setting element (8) and configured to define the beginnings of injection steps during the execution of the method of claim 1;
- A reflectometry signal generation unit (10) connected on the one hand to the timing clock (9) and on the other hand to the conversion element (5), the generation unit (10) being configured to generate the reflectometry signals based on parameters defined by the timing clock (9) and the setting element (8).

9. An avionics system including a reflectometry detection device according to claim 8.

* * * * *